(12) United States Patent
Kieda et al.

(10) Patent No.: US 6,222,409 B1
(45) Date of Patent: Apr. 24, 2001

(54) VARIABLE ANALOG DELAY LINE FOR ANALOG SIGNAL PROCESSING ON A SINGLE INTEGRATED CIRCUIT CHIP

(75) Inventors: David B. Kieda; Michael H. Salamon, both of Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 09/356,111

(22) Filed: Jul. 16, 1999

(51) Int. Cl.⁷ ...................................... H03H 11/26
(52) U.S. Cl. .......................... 327/283; 327/337; 327/268; 327/278
(58) Field of Search .................................... 327/267, 264, 327/268, 275, 277, 278, 272, 282, 283, 285, 293, 337; 307/110

(56) References Cited

U.S. PATENT DOCUMENTS 5,012,143 * 4/1991 Boudewijns ........................ 327/277
5,680,070 * 10/1997 Anderson et al. .................... 327/337
5,825,230 * 10/1998 Chen et al. .......................... 327/337
6,054,884 * 4/2000 Lye ..................................... 327/271

* cited by examiner

*Primary Examiner*—Timothy P. Callahan
*Assistant Examiner*—An T. Luu
(74) *Attorney, Agent, or Firm*—Trask Britt

(57) ABSTRACT

Programmable analog delay line devices for analog signal processing are constructed on a single integrated circuit chip using a switched capacitor storage scheme for short-term storage of the voltage or charge waveform. These devices provide variable maximum delay times without signal attenuation and with delay-to-risetime ratios of up to $10^2$ to $10^3$. A vector array of switched capacitor analog storage elements may be arranged in a ring-buffer topology, with the number of switched capacitor elements ranging from between about 10 and about $10^5$. Two internal counters incremented by a common clock keep track of the variable delay between an input signal and an output signal.

22 Claims, 7 Drawing Sheets

VARIABLE ANALOG DELAY LINE FOR ANALOG SIGNAL PROCESSING ON A SINGLE INTEGRATED CIRCUIT CHIP

BACKGROUND OF THE INVENTION

1. Field of the Invention

This invention relates to electronic circuit components, and particularly to variable analog delay line devices for analog signal processing on a single integrated circuit chip using a switched capacitor storage scheme.

2. State of the Art

A delay line in an electronic circuit functions to insert a time increment between a signal and a replicated version of that signal. Such a device finds application for signal processing in various contexts. Several varieties of delay lines are commercially available:

Active delay lines have inputs and outputs which are buffered with logic drivers, typically transistor-transistor logic (TTL) and emitter-coupled logic (ECL). Active delay lines are digital only; that is, they have no analog delay capability. Most companies which produce digital delay lines also provide "programmable" delay devices, whose chips have a 3-bit to 8-bit (usually 3 to 5-bit) input address for discretely variable delays up to the maximum. Typical maximum delay times for these devices range from 0.1 to 1000 ns. The delay-to-risetime ratio inherent to these devices is not meaningful, because their outputs are actively buffered. (Hence, the signal output risetime is a function of the digital buffer).

Passive, lumped constant, delay lines contain no active elements (such as logic drivers). They consist of inductive and capacitive components, which provide a fixed delay time. Usually, these devices include taps, which selectively provide a range of delay values up to a given maximum. Commercially available delay lines of this type offer maximum delay times ranging from 1 to 1000 ns, with delay-to-risetime ratios varying from 3 to 10 (most being between 3 and 6), and signal attenuations up to 12%. Apparently, the vendors of passive delay lines offer no "programmable" analog delay line. It is understood that to do so would require much more circuitry on the chip, because a linear driver would be required for each output port.

Cable delay lines comprise coaxial cables cut to specific lengths to provide fixed signal delays. Cable delay lines are characteristically expensive, heavy and large; they also tend to be quite dispersive for delays longer than 100 ns. "Programmable" cable delay lines are available, in which a binary sequence of cable lengths is switched into a total delay line, not exceeding 100 ns of total delay.

Trombone delay lines are basically wave guide cavities structured so that their lengths can be very accurately adjusted with a vernier. These devices provide very short but precise and adjustable delay times. Trombone delay lines are available having 2 ps timing resolution over 5 ns of delay, continuously variable with a mechanical knob or vernier.

Other types of delay lines include air dielectric tuned resonators, which are available for fixed delays at specified central frequencies. These resonators are used for RF applications, typically at ~1 GHz, and are suitable for high power applications as well. "Non-dispersive" delay lines may be obtained for center frequencies of 30 to 1400 MHZ, with delays from 0.2 to 20 microseconds and bandwidths from 5 to 100 MHZ.

The great majority of existing analog delay devices are of the "lumped constant" design, which consist of "lumped" inductors and capacitors in a transmission line configuration. (For signal delays of less than one microsecond, the commercial delay lines are usually in chip form.) These devices offer poor delay-to-risetime ratios and all cause significant signal distortion and some degree of signal attenuation. When higher performance delay characteristics are required (less signal dispersion and attenuation), the only previously available recourse has been to rely upon cable delay lines. However, cable delay lines are extremely expensive, heavy, bulky, and often difficult to incorporate into an electronics system.

Several US patents disclose recent advances in delay line devices. U.S. Pat. No. 5,453,710 discloses a quasi-passive switched capacitor delay line including a predetermined number of passive switched capacitor delay stages and an amplifier. Each delay stage includes a first transistor having a control terminal for receiving a clock phase, an input terminal for receiving an input signal, and an output terminal, a second transistor having a control terminal for receiving a different clock phase, an input terminal connected to the output terminal of the first switching device, an output terminal coupled to the amplifier input, and a capacitor coupled between the output terminal of the first transistor and a common supply voltage.

According to U.S. Pat. No. 5,291,083, a "bucket brigade" analog delay line with voltage limiting feedback includes an input stage for receiving an input signal and a series of delay stages coupled to the input stage for propagating the input signal through the line. Each delay stage contains a storage capacitor for holding either a signal charge or a reference charge, a transfer device for transferring charge from one stage to another at regular clock intervals, and a tap circuit for allowing external sampling of the propagated input signal. Similarly, U.S. Pat. No. 4,771,196 discloses an electronically variable active analog delay line that utilizes cascaded differential transconductance amplifiers with integrating capacitors and negative feedback from the output to the input of each noninverting amplifier.

U.S. Pat. No. 4,999,799 discloses an apparatus for producing the Fourier coefficients of a time and/or space-varying input signal utilizing a bank of delay filters whose outputs are selectively connected to the inputs of a bank of accumulating circuits, each of which produces one of the desired Fourier coefficients.

U.S. Pat. No. 4,475,170 discloses a delay network including a plurality of signal sample and hold circuits selectively connected to an input bus to which the analog input signal is applied. Each sample and hold circuit is formed utilizing a storage capacitor and a source follower, thereby requiring less area on a semiconductor device surface than other sample and hold circuits which utilize operational amplifiers.

SUMMARY OF THE INVENTION

This invention provides an analog delay line characterized by variable maximum delay times with no appreciable signal attenuation and delay-to-risetime ratios of up to $10^2$ to $10^3$. These devices are programmable, enabling real-time variation of the delay over approximately $10^5$ selectable values. Unlike previously available analog delay lines, the present invention can function as a universal delay line, in that the maximum delay time (hence effective bandwidth) can be varied over a range of values. One method for adjusting the delay time is via a control voltage input. Alternatively, jumper configurations may be changed to determine an offset.

A notable design feature of the analog delay line of the instant invention is the use of a switched-capacitor storage scheme for short-term storage of the voltage or charge waveform. In an exemplary embodiment, an array of switched capacitor analog storage elements is arranged in a ring-buffer topology, with the number of switched capacitor elements ranging from a minimum of about 10 up to a practical limit several orders of magnitude higher, currently to nearly $10^5$.

Two internal counters (I and J) determine the analog delay between the input signal and the output signal. Index counter I determines the location to store the present input analog information in the capacitive element. Index counter J determines the location to read the analog information for the output of the device. The index counters I and J are both incremented through an internal or external clock after a time $\Delta$. The address difference between the index counters I and J, $\delta_{ij}$, is an externally programmable constant. The delay time for an analog signal to reach the output from the input is therefore $\delta t = \Delta \delta_{ij}$. For CMOS, FET, or bipolar implementation of the circuit, one may expect $\Delta \geq 0.5$ nsec, and $0 < \delta_{ij} < 10^5$, allowing 1 GHz bandwidth analog signals to be delayed up to millisecond time scales in nanosecond time increments. Other semiconductor implementations such as GaAs may increase bandwidth to over 10 GHz with maximum delay times on the order of microseconds to milliseconds.

Several implementations of the write/read circuit are possible. Separate input and output analog busses may be utilized independently to access the switched capacitor elements. Alternatively, a single access bus with appropriate analog switching elements and sample-and-hold circuitry may be utilized to reduce circuit layout complexity.

The delay interval between reading and writing may be input into the circuit in several different ways. If a 40 pin package is used to accommodate the circuit, sufficient pins are available to load a 32 bit address into both index counters at the device initialization. If lower pin count is desired, a serial port interface can be established over a single wire into the circuit. A micro controller or serial-to-parallel Finite State machine would translate the serial data and initialize the buffers. Such an implementation allows device packaging on an 8 pin DIP or SOT package, further reducing costs and increasing packing density.

In an exemplary embodiment, the device is controlled by a frequency generator, or clock signal, which is fed into the device from an external source. This arrangement provides additional circuit design freedom. External capacitors and resistors may be used in conjunction with the circuit to smooth the analog output and limit aliasing effects on the input.

An alternate design uses a CCD-type cascaded storage bank to provide the necessary delay. Such an implementation consumes substantially more power due to the energy expended moving all the electric charges into adjacent potential wells each clock cycle. This type of design has been previously tried, and the resulting output signal after long delays is substantially degraded. The performance of this type of device is therefore unacceptable for long (microsecond) delays.

The delay device of this invention is potentially useful for any application involving time-domain manipulation of high-bandwidth analog signals, particularly because no other means of nondispersive delay exist for long signal delay times at large bandwidth. Typical applications for the device include analog signal processing, high energy physics, astrophysics, and high speed digital filter design. Exemplary applications include:

High Energy Physics Experiments:

Many data acquisition systems for these experiments require a substantial amount of time to calculate whether a trigger occurred before actually causing the flash analog-to-digital converter (FADC) to digitize the input voltage/charge. Typical delay times before decision to digitize is 1 microsecond. The usual solution is to use a large coil of cable, at a substantial weight/cost disadvantage. Furthermore, the signal drivers necessary to drive such long cables can dissipate power similar to the power requirements of the above-described CCD-type cascaded storage bank technology. These considerations are of substantial interest for balloon/satellite experiments, where additional weight will result in a substantially higher launch price.

Dynamic Correction of Delay Times for Fast Signals Measured Over a Widely Spaced Detector Array:

Typical applications of this type include the construction of a wide field, narrow beam, electronically steerable antenna for RADAR/SONAR installations. These arrays may also be applied to effect aperture synthesis for widely spaced discrete detectors, such as astronomical instruments, radio instruments, extended light detection arrays, etc. In several large scale (kilometer separation) physics projects, event triggers may not be formed for several milliseconds after occurrence of the event. These delays can provide the necessary storage time for the waveforms at each station while waiting for the trigger to form. The storage of the waveforms on the capacitor bank as opposed to continuously digitizing the waveform also saves substantial power as continuous high speed ADC conversion is heavily power consumptive. A substantially more sensitive laser system for atmospheric monitoring (LIDAR) can be constructed with this device.

Universal Replacement of Lumped-Sum Digital/Analog Delay Lines:

There exist a number of medium size companies whose primary or secondary products are fixed delay lines. It is estimated that about 1000 different analog-digital delay types are presently available, and that the delay line of this invention could replace approximately 90% of those types at lower cost per delay line. Device performance of the invention exceeds market technology by several orders of magnitude. The invention further offers substantial weight and size reduction, as well as increased reliability. Test equipment, such as digital oscilloscopes, for example, could use the devices of this invention for delayed triggering of high speed signals Data Acquisition Systems for Medical Imaging Devices Such as Cat Scan or NMR:

These devices often return fast electrical signals substantially after an initializing pulse. The high bandwidth delay line of this invention enables those skilled in the art to increase signal/noise ratio in the receiver and substantially increase device resolution/sensitivity.

Digital Filter Design:

The availability of longer delays at higher frequencies allows substantial extension to existing digital design capabilities. Digital filtering algorithms can be extended to signal bandwidths up to several GHz with substantially sharper bandpass/highpass/lowpass filter characteristics. Such devices could be used for telecommunications processes such as signal multiplexing/demultiplexing, substantially more selective AM/FM filtering, etc. Additional taps onto the switched capacitor ring buffer can be added to increase design flexibility. Extremely narrow band filters for radio, TV and cellular phone communication, which are not constructable using existing technology, can be constructed using a device constructed according to principles of this invention. For example, real time video signal processing such as pattern recognition can be performed using this type of device.

A presently preferred embodiment of the invention comprises a silicon-based chip which offers unmatched capabilities for time-domain processing of analog signals up to bandwidths of the order of 1 GHz. Chips incorporating advanced doping constituents, such as GaAs, allow processing of analog signals up to bandwidths of the order of 10 GHz. An exemplary embodiment is a variable analog delay line, based on switched-capacitor array technology.

One embodiment of a variable analog delay device according to principles of this invention is based on bipolar current sampling of CMOS storage capacitor arrays. The basic delay line is an addressable analog storage array, arranged in a ring buffer topology of capacitors serving as storage pixels. The input waveform is sampled at a fixed clock rate (e.g. 200 MHZ) and stored in the analog ring buffer, incrementing the storage pixel address each clock period. Reading occurs simultaneously at the same clock rate, but at a (variable) address offset from the writing address. The difference between the writing address and the reading address times the clock period is the desired delay time; the output waveform is thus a sampled and delayed copy of the input waveform, with a precision given by the bit-depth per pixel. The maximum delay to rise time ratio is approximately the number of storage pixels (capacitors) in the device. The maximum bandwidth is approximately one half of the sampling frequency (~100 MHZ with the present example's 200 MHZ fixed clock rate). The time delay between input and output signals is programmable and is quickly varied by simply changing the digital offset between the writing address and the reading address.

A second embodiment of a variable analog delay device according to principles of this invention comprises means for receiving a time varying input signal having a waveform; a vector array of capacitor elements for short-term storage of the input signal waveform; means to switch between writing locations comprising individual capacitors of the vector array for the purpose of writing discrete values of the input signal waveform into the individual capacitors of the vector array, wherein the discrete written values correspond to values of the input waveform at discrete time steps; advancing means, interfacing with the switching means, the advancing means functioning to increment the storage address of the individual capacitors from one to each subsequent one in a repeatable order, and the advancing means being incremented by a circuit control signal; means to switch between individual capacitors of the storage array for the purpose of reading discrete values of the input signal stored therein, the capacitors being located at an offset from the writing locations, wherein the offset between writing and reading locations comprises a time delay from the writing operation; and means to output a signal in correspondence with the input signal, but having discrete waveform values corresponding to the input signal at discrete time steps and exhibiting a time delay from the input signal. The offset between writing and reading locations may be programmed with an initial value, or determined by jumper settings. The offset may also change due to a feedback loop provided in the circuit. The circuit control signal may originate internal or external to the device, and typically comprises an output signal from a frequency generator, such as a clock. The circuit control signal, in general, functions to operate the device, and determines the time increment between consecutive writing operations of discrete values of the input signal. A feedback loop may also be provided in a device according to this invention to vary the circuit control signal. Input and output signals may each be modified by a filter circuit prior to writing and subsequent to reading operations, respectively.

A device according to this invention may be manufactured on a single integrated circuit having inputs to receive an externally programmable signal which controls the offset value between writing and reading locations. Such a device may further comprise inputs, e.g. terminals or connectors of some sort, to receive the circuit control signal. One embodiment utilizes an 8 pin surface mounted package, thereby accommodating a serial signal input to control the offset between writing and reading locations. Another embodiment is configured and arranged in a 40 pin surface mounted package, thereby accommodating a 32 bit binary control signal input to control the offset between writing and reading locations.

BRIEF DESCRIPTION OF THE DRAWINGS

In the drawings, in which like elements are designated with like numerals, and which illustrate what is presently regarded as the best mode for carrying out the invention.

DETAILED DESCRIPTION OF THE ILLUSTRATED EMBODIMENTS

Figure 1:
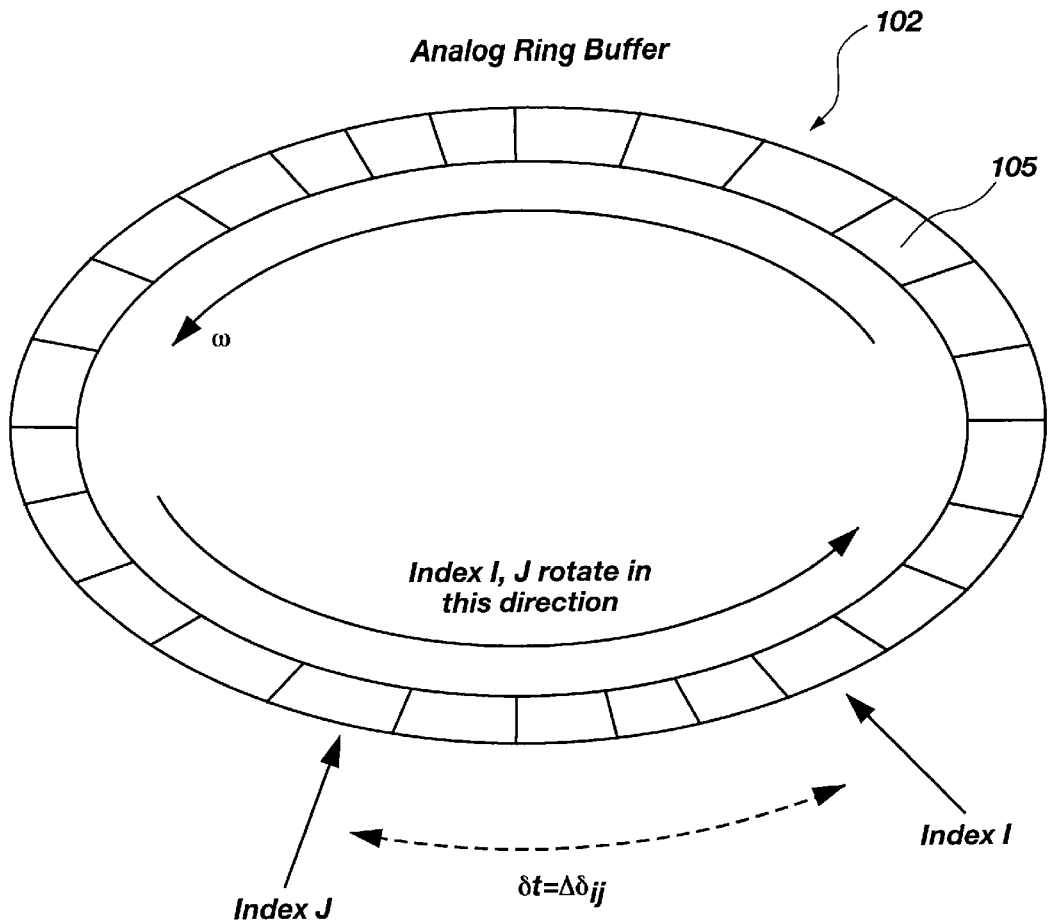
FIG. 1 is an illustration of an analog ring buffer of the invention.

An analog ring buffer, generally designated 102, is illustrated in FIG. 1. Analog ring buffer 102 comprises a series of switched capacitor elements 105 that may be conceptualized as having a circular configuration. One feature of a ring buffer is that the process of switching from one capacitor to the next in series remains similar throughout the bank of capacitors. This feature provides for uniform timing in writing or reading in a continuous loop. The number of individual capacitor elements 105 present in the ring buffer 102 may vary between only a few, e.g., 10, up to the maximum permitted by available materials and construction techniques, e.g., $10^5$ or more. The number of capacitor elements 105 present in a delay device is determined by several factors, including circuit controller clock frequency, desired delay time and "smoothness" of the output signal.

The minimum practical number of capacitor elements 105 in the buffer 102 is determined by the reality that the input signal varies periodically with time, and a certain number of discrete points per cycle are required to retain sufficient information to faithfully recreate the signal after a time delay. Theoretically, a minimum of only two capacitors are needed in an operable device, but the information that may be recreated in this configuration is merely "on" or "off;" that is, no information about the time varying nature of the input signal is retained. Also, in a two capacitor configuration, the time delay would be limited to one cycle of the circuit controller clock. The upper practical limit of $10^5$ capacitors is based upon current manufacturing constraints, where the properties of the individual capacitors must maintain a certain uniformity. The physical nature of silicon crystals currently establishes the upper limit as a practical manufacturing constraint. Typical variations in the silicon substrate and doping lead to capacitance dispersion which can detrimentally affect the replicated signal.

In terms of voltages or potentials, an input signal is digitized and discrete potentials, corresponding to the value of the input signal at individual time slices determined by controller clock cycles, are stored on corresponding individual capacitor elements 105. The storage location of an input signal is determined by the value of index I and is illustrated by arrow I. A read location for an output signal is determined by the value of an index J, as illustrated by arrow J. As the indices are incremented, the storage and read locations effectively rotate as indicated by the arrow designated (omega). It should be noted that either the potential or the charge stored by the individual capacitors 105 may be read as an output. Potentials may be acquired more quickly, and are thus currently preferred for application of the present invention.

The time delay between writing (input signal) and reading (output signal) values is preferably a programmable quantity. The time delay value, indicated by arrow δt, is given by $\delta t = \Delta \delta_{ij}$, or time delay equals the clock increment times the number of individual capacitor elements 105 between writing and reading locations. The controlling clock may be either internal or external to the device of this invention.

As the number of storage capacitors 105 increases, a true ring structure may not be feasible or efficient to construct on an integrated circuit chip. In this case, a more workable configuration might be as an array of storage capacitors located in an X-Y plane. For this configuration, write and read indices I and J would then become $I_{xy}$ and $J_{xy}$, both indices having X and Y values corresponding to locations within the array. In any case, the time delay value is given by $\delta t = \Delta \delta_{ij}$, or time delay equals the clock increment times the number of individual capacitor elements 105 between writing and reading locations. Alternatively, an equivalent ring structure may be formed as a vector array of capacitors. Such a vector array conceptually may have multiple continuously connected rows which are "folded" to turn the corners at the row ends. A vector array therefore provides dense packing of capacitor elements on an integrated circuit chip, and maintains the nature of a ring. In a vector array, no latency is introduced by having to switch from, for example, one end of a discrete row of capacitors to the beginning of the row, as the switching is self-similar completely throughout both the vector array and ring structure. With each write or read cycle, the circuit merely shifts over to the next adjacent capacitor. The switch from the first capacitor to the second capacitor, and each subsequent capacitor, is substantially equivalent to switching from the last capacitor to the first capacitor.

Figure 2:
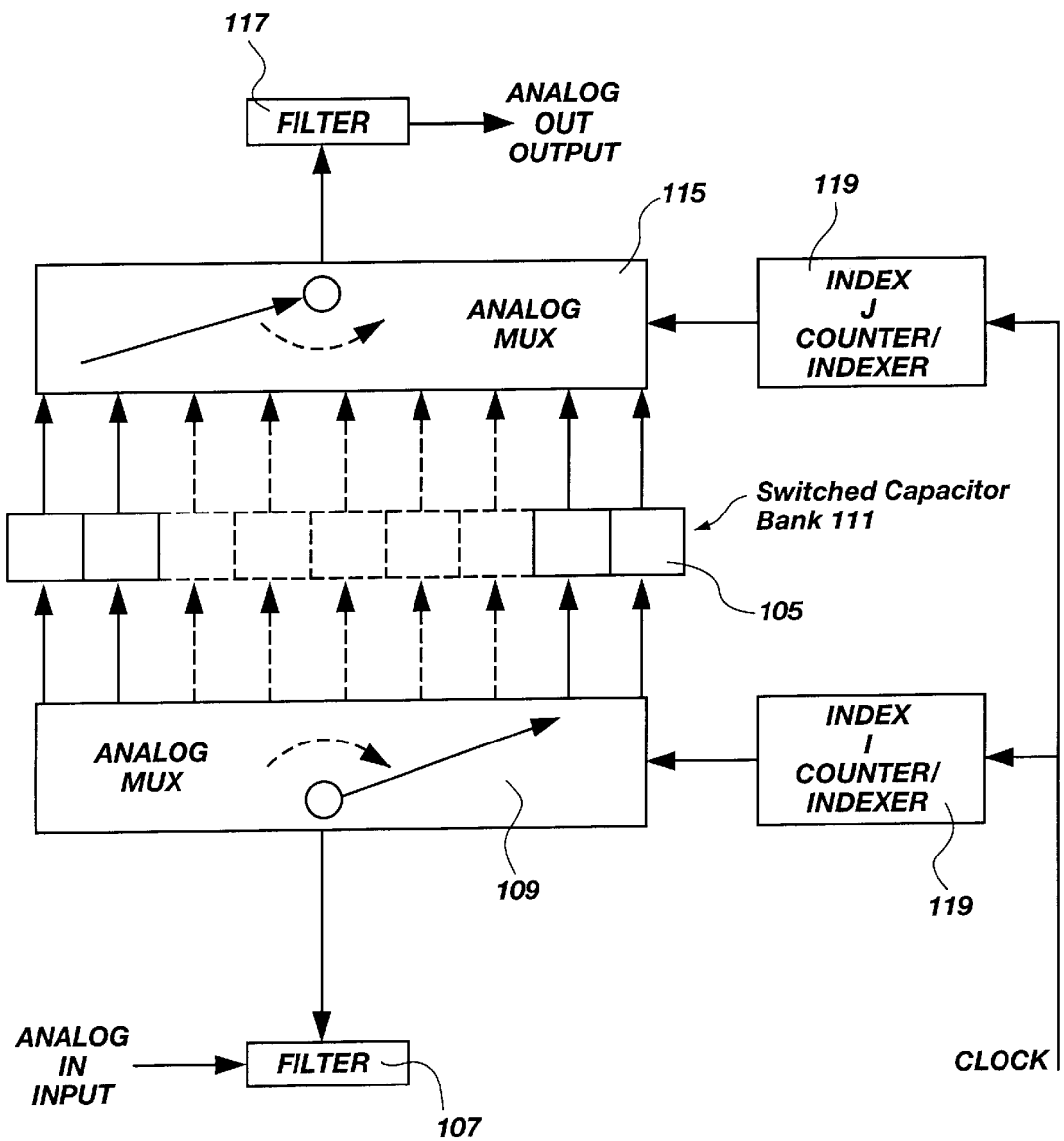
FIG. 2 is an illustration of a device of this invention, incorporating a switched capacitor bank and separate read and write busses.

Several implementations of the write/read circuit are possible. One may choose to use separate input and output analog busses to independently access the switched capacitor elements, as illustrated in FIG. 2. In this arrangement, the input signal is illustrated as being input to an optional filtering circuit element 107 before it reaches an analog multiplexor 109. The multiplexor 109 determines the storage location, or individual capacitor 105, for the discretized value of the input signal within the switched capacitor bank 111. After a programmable time delay, analog multiplexor 115 reads the value of the signal from individual capacitors 105. The output signal may again be filtered by optional filter circuit element 117. Analog multiplexors 109 and 115 are assigned respective write and read locations by corresponding indices I and J. Counters 119 for indices I and J are incremented by a signal from a common clock, illustrated as arrow C. The time delay is programmable by adjusting the offset between the two indices. The offset between indices may be adjusted in various ways, such as by jumper settings, or more preferably, by an input signal such as a voltage. Again the time delay is given by $\delta t = \Delta \delta_{ij}$, or time delay equals the clock increment times the number of individual capacitor elements 105 between writing and reading locations.

Figure 3:
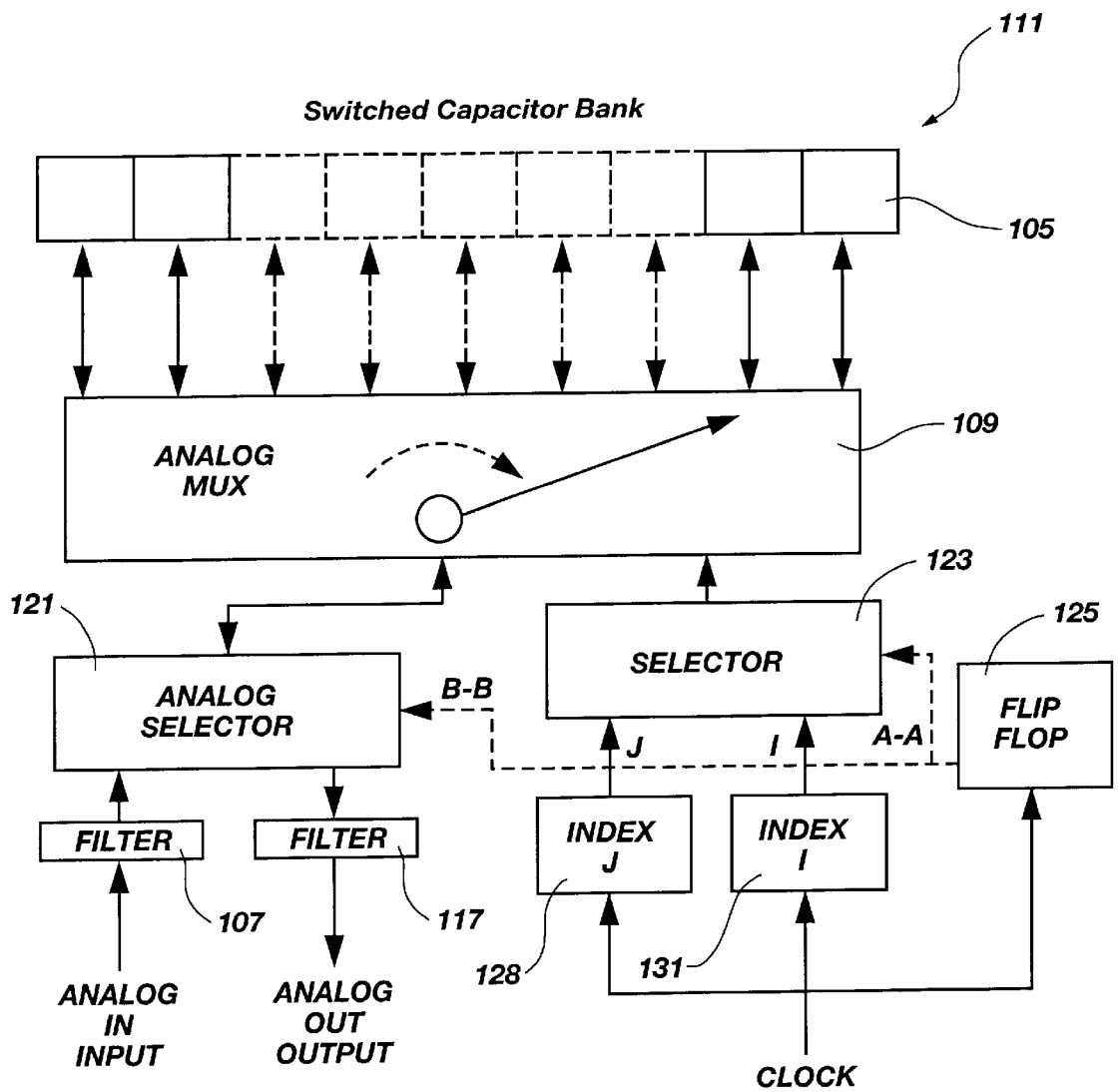
FIG. 3 is an illustration of a device of this invention, incorporating a single access bus, with analog switching elements and sample-and-hold circuitry.

In an alternative embodiment, a single access bus may be used as illustrated in FIG. 3, with appropriate analog switching elements and sample-and-hold circuitry to reduce circuit layout complexity. An input signal is illustrated as being input to an optional filtering circuit element 107 before it reaches an analog selector 121. Analog selector 121 switches between input and output configurations. Continuing on the input path, the input signal from selector 121 is received by multiplexor 109 and written into a capacitor 105 in capacitor bank 111. The writing location is controlled by index I. Analog multiplexor 109 is switched between input and output configurations by selector 123 under control of flip-flop element 125 as indicated by dashed line A—A. The multiplexor 109 therefore switches between write and read locations which are determined by indices I and J. Flip-flop element 125 also controls selector 121, as indicated by dashed line B—B. The circuit is run by a signal from a clock element, designated by arrow C. The clock signal C, as illustrated, is a common input to counters 128 and 131, and flip-flop element 125. Counters 128 and 131 increment indices J and I respectively. The offset value between indices I and J may be programmed to provide a variable delay time.

Figure 4:
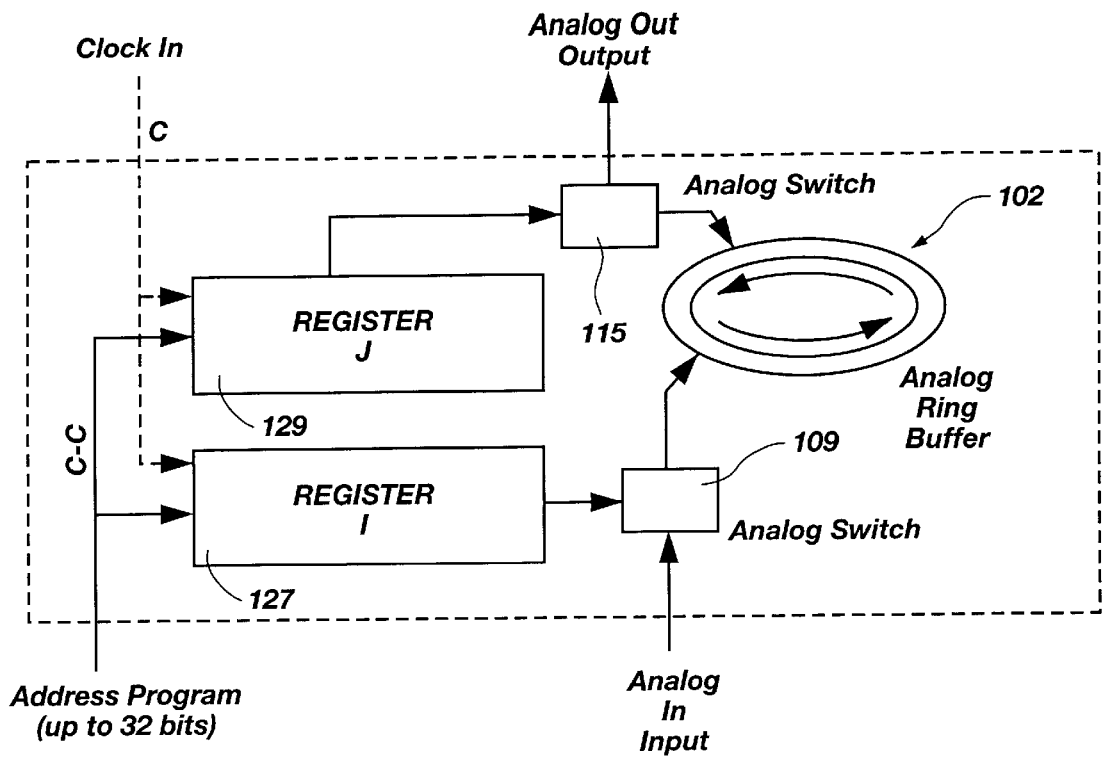
FIG. 4 is an illustration of an embodiment of this invention constructed in association with a 40 pin package.

FIG. 4 illustrates a delay line device constructed according to principles of the invention wherein read and write indices are stored in registers 127 and 129 respectively. This circuit might be packaged as a 40 pin component. A 32 bit address provides the offset between indices, as illustrated by the double arrowed line C—C. A 40 pin element may pass a 32 bit address using 34 pins, leaving 1 pin each for input and output signals, 1 pin for the clock signal, and 3 pins for power. Index values for I and J are incremented by a common clock signal, illustrated by dashed line C. As in previous example circuits, analog multiplexor 109 selects the appropriate storage capacitor in ring buffer 102 based upon the value of write index I. Similarly, the reading location is selected by multiplexor 115 based upon the value of read index J.

Figure 5:
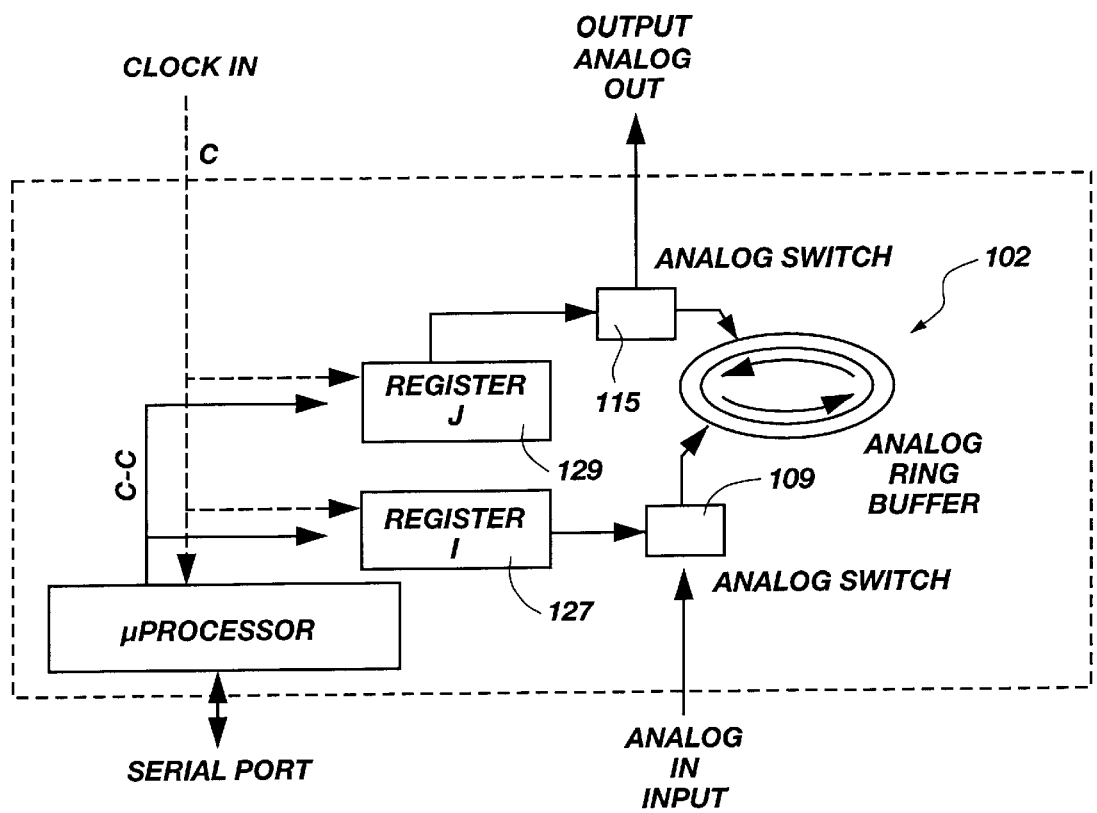
FIG. 5 is an illustration of a preferred embodiment of the invention in which a serial port interface is established over a single wire into the circuit.

A highly preferred embodiment is illustrated in FIG. 5. This embodiment is substantially similar to the embodiment of FIG. 4, except the circuit may be packaged as an 8 pin component. Register values for indices I and J are provided by a microprocessor fed by a serial port. The serial port may be established using 2 pins, leaving 1 pin each for input and output signals, 1 pin for the clock signal, and 3 pins for power. Again, index values for I and J are incremented by a common clock signal, illustrated by dashed line C. As illustrated, analog multiplexor 109 selects the appropriate storage capacitor in ring buffer 102 based upon the value of write index I. Similarly, the reading location is selected by multiplexor 115 based upon the value of read index J.

Figure 6:
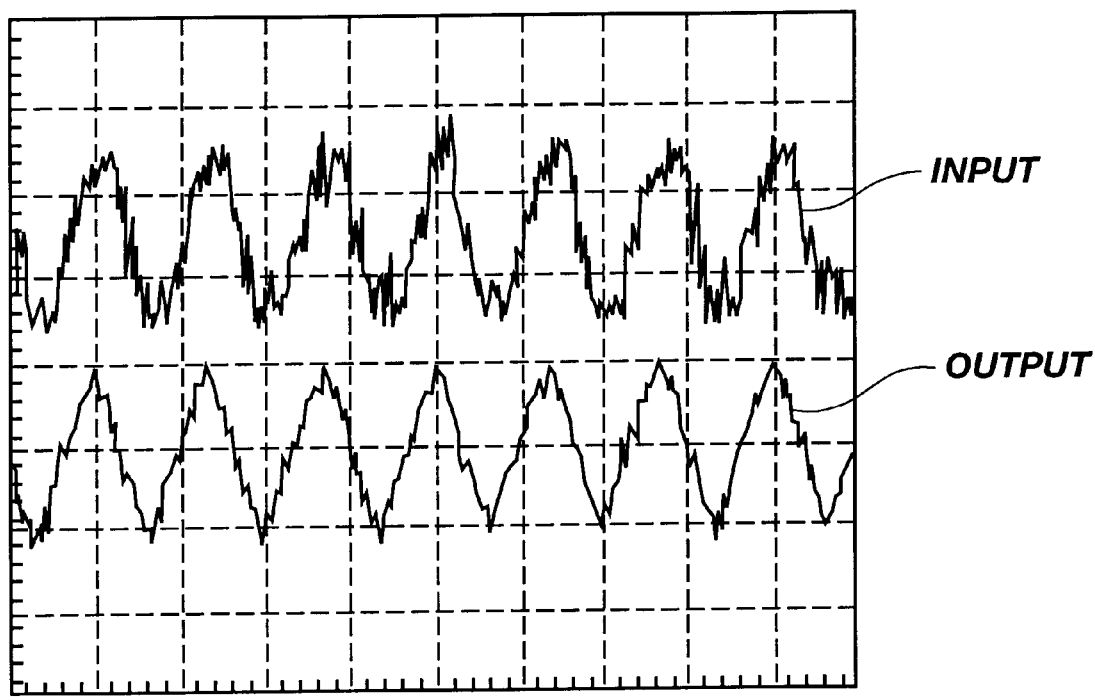
FIG. 6 is a signal chart, illustrating an original signal and the replicated signal having a delay after processing by a device of this invention.

FIG. 6 illustrates an original signal and the replicated signal having a time delay after processing by a circuit of this invention. The waveform designated "Input" exhibits some noise, wherein higher frequency oscillations appear about the lower frequency signal waveform. The waveform designated "Output" exhibits a discretized replication of the "Input" waveform, but has a delay in time from the original signal, and has filtered out the higher frequency noise from the original "Input" signal. The "Output" waveform comprises a series of stepped values corresponding to individual discretized values for the input waveform, each such discrete value having been stored in an individual capacitor of the switched capacitor storage bank.

Figure 7:
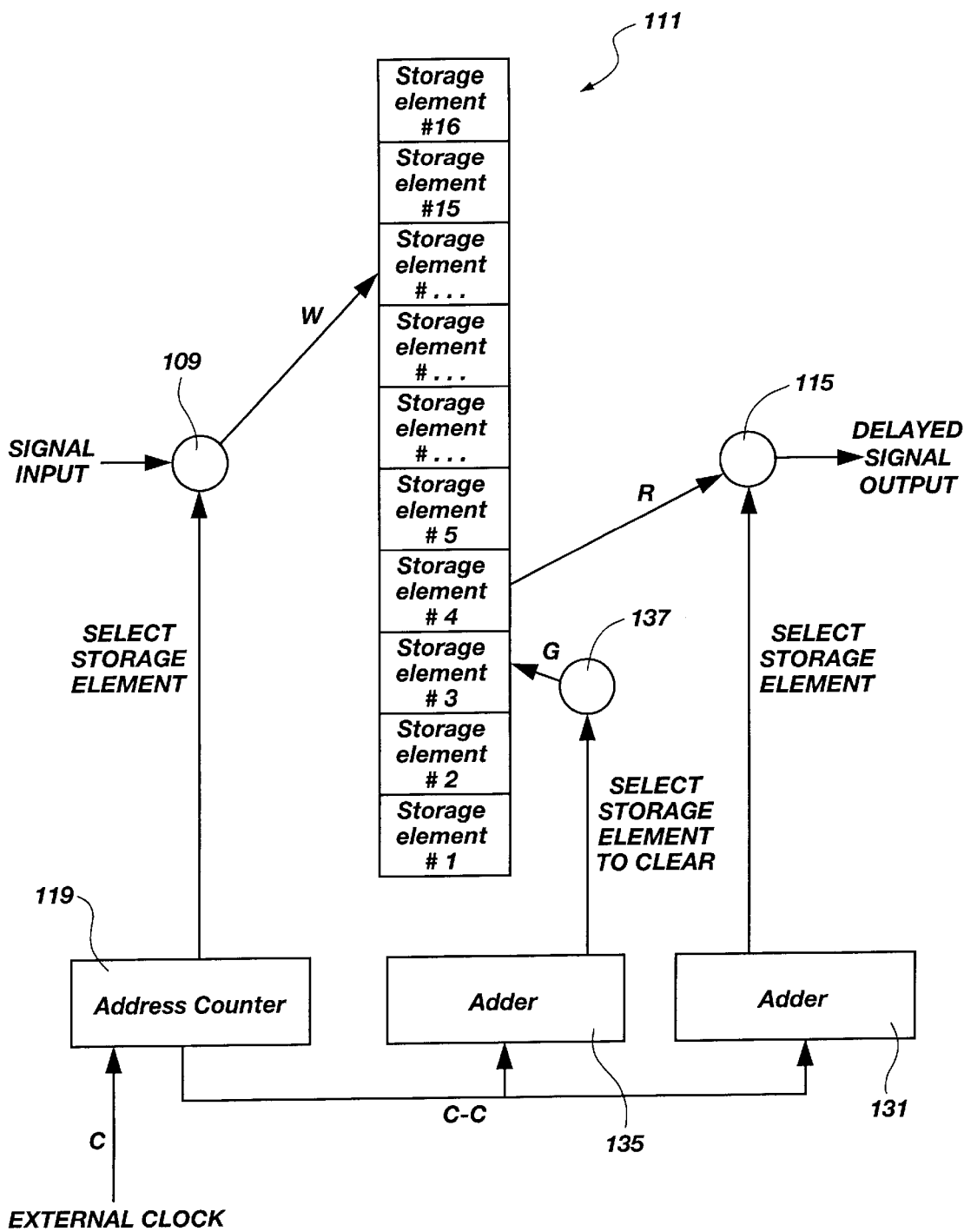
FIG. 7 is an illustration of a device of this invention, indicating circuit write, read and grounding elements.

FIG. 7 illustrates another embodiment of this invention, having 16 capacitors in a switched capacitor storage bank 111. An input signal is typically received by input terminals of any convenient type (not shown). These input terminals may comprise hardware such as, but not limited to: screw terminals, spring actuated clamps, soldered connections, or plug-in connectors. (Equivalent terminating connector devices are generally provided for the output signal). From the input terminals or connectors, the signal passes to an analog multiplexor 109 and is stored as discrete values in individual capacitors in capacitor bank 111. The particular capacitor for each such storage operation is determined by a value passed to multiplexor 109 by address counter 119 under control of a signal from a source such as an external clock. The clock signal is illustrated by the arrow designated C. Multiplexor 115 reads a time delayed output signal value from a capacitor whose location is determined by a signal from adder/subtractor 131. The read operation is illustrated by the arrow designated R. Adder/subtractor 131 provides a programmable offset between the read and write locations subsequent to processing the signal received from address counter 119. Multiplexor 133 grounds or "zeros out" the capacitor, clearing and preparing it for a subsequent write operation. The grounding or clearing operation is illustrated by the arrow designated G. As illustrated, adder/subtractors 135 and 131 receive the same counter signal, designated by double arrowed line C—C. A different offset is programmed into each of adder/subtractors 131 and 135 to effect a clearing operation subsequent to a reading operation.

It is within contemplation to construct a circuit such as illustrated in FIGS. 2–5, but having only one counter which would increment both indices. A programmable offset providing a differential between the indices would still be provided. The offset between indices gives the number of capacitor elements 105 between writing and reading locations. Again the time delay is given by $\delta t = \Delta \delta_{ij}$, or time delay equals the clock increment times the number of individual capacitor elements 105 between writing and reading locations. The example circuits incorporate single ended input and output signals, assuming a common system ground. Such input and output signals are not a limitation of the circuits of this invention, and differential input and output signals are also workable.

The invention as illustrated and described may comprise discrete elements assembled on a printed circuit board (PCB) or may be manufactured on an integrated circuit chip. In any case, certain elements, including but not limited to the circuit controlling frequency generator or clock signal, or various different means to programmably control an offset between indices I and J, may be either internal or external to the circuit. The programmable offset between indices may incorporate feedback from either the processed signal or any other source. Similarly, the circuit control signal may incorporate feedback from the processed signal, or any other source.

What is claimed is:

1. A device for signal processing, comprising:

means for receiving a time varying input signal having a waveform;

a switched capacitor storage array for short-term storage of said input signal waveform;

means to switch between writing locations comprising individual capacitors of said storage array for the purpose of writing discrete values of said input signal waveform into said individual capacitors of said storage array, wherein said discrete values correspond to values of said input signal waveform at discrete time steps;

advancing means, interfacing with said switching means, said advancing means functioning to increment a storage address of said individual capacitors from one to each subsequent one in a repeatable order, and said advancing means being incremented by a circuit control signal;

means to switch between said individual capacitors of said storage array for the purpose of reading discrete values of said input signal waveform stored therein, said individual capacitors being located at an offset from said writing locations, wherein said offset between writing and reading locations comprises a time delay from a writing operation; and means to output a signal in correspondence with said input signal, but having discrete waveform values corresponding to said input signal at discrete time steps and exhibiting a time delay from said input signal.

2. A device according to claim 1, structured and arranged such that said switched capacitor storage array comprises an analog ring buffer.

3. A device according to claim 2, structured and arranged such that a offset between writing and reading locations is programmable with an initial value.

4. A device according to claim 3, structured and arranged such that said circuit control signal is an output signal from a frequency generator.

5. A device according to claim 4, structured and arranged such that said frequency generator comprises a clock.

6. A device according to claim 4, structured and arranged such that said frequency generator comprises an oscillator circuit.

7. A device according to claim 3, structured and arranged such that said circuit control signal comprises feedback from a second control signal.

8. A device according to claim 3, structured and arranged such that said circuit control signal comprises feedback from said output signal.

9. A device according to claim 3, structured and arranged such that said offset further comprises feedback from a second control signal.

10. A device according to claim 3, structured and arranged such that said offset further comprises feedback from said output signal.

11. A device according to claim 3, further comprising a filtering circuit to modify said input signal prior to storage of said discrete values.

12. A device according to claim 3, further comprising a filtering circuit to modify said output signal subsequent to reading of said discrete values.

13. A device according to claim 3, structured and arranged such that said switching means for said writing and reading locations comprises a multiplexing circuit component element.

14. A device according to claim 4, structured and arranged such that said advancing means comprises a counter.

15. The device of claim 3, structured and arranged such that said analog ring buffer comprises an assembly of capacitors manufactured on an integrated circuit chip.

16. A device for signal processing, comprising:

means for receiving a time varying input signal having a waveform;

a vector array of capacitor elements for short-term storage of said input signal waveform;

means to switch between writing locations comprising individual capacitors of said vector array for the purpose of writing discrete values of said input signal waveform into said individual capacitors of said vector array, structured and arranged such that said discrete values correspond to values of said input signal waveform at discrete time steps;

advancing means, interfacing with said switching means, said advancing means functioning to increment a storage address of said individual capacitors from one to each subsequent one in a repeatable order, and said advancing means being incremented by a circuit control signal;

means to switch between said individual capacitors of said storage array for the purpose of reading discrete values of said input signal waveform stored therein, said capacitors being located at an offset from said writing locations, structured and arranged such that said offset between writing and reading locations comprises a time delay from a writing operation; and means to output a signal in correspondence with said input signal, but having discrete waveform values corresponding to said input signal at discrete time steps and exhibiting a time delay from said input signal.

17. A device according to claim 16, structured and arranged such that said offset between writing and reading locations is programmable with an initial value.

18. A device according to claim 17, structured and arranged such that said circuit control signal comprises an output signal from a frequency generator.

19. A device according to claim 18, structured and arranged such that said device is manufactured on a single integrated circuit having inputs to receive an externally programmable signal which controls said offset between writing and reading locations.

20. A device according to claim 19, further comprising inputs to receive said circuit control signal.

21. A device according to claim 20, configured and arranged in an 8 pin surface mounted package, thereby accommodating a serial signal input to control said offset between writing and reading locations.

22. A device according to claim 20, configured and arranged in a 40 pin surface mounted package, thereby accommodating a 32 bit binary control signal input to control said offset between writing and reading locations.

* * * * *